(12) United States Patent
Sahasrabudhe et al.

(10) Patent No.: US 8,154,109 B2
(45) Date of Patent: Apr. 10, 2012

(54) LEADFRAME HAVING DELAMINATION RESISTANT DIE PAD

(75) Inventors: Kapil H Sahasrabudhe, Dallas, TX (US); Steven A Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 12/888,527

(22) Filed: Sep. 23, 2010

(65) Prior Publication Data

US 2011/0012243 A1    Jan. 20, 2011

Related U.S. Application Data

(62) Division of application No. 12/131,978, filed on Jun. 3, 2008, now Pat. No. 7,821,113.

(51) Int. Cl.
*H01L 23/495* (2006.01)
(52) U.S. Cl. .................. 257/666; 257/E23.037
(58) Field of Classification Search .................. 257/666, 257/676, E23.037, 678, 690, 731
See application file for complete search history.

(56) References Cited

U.S. PATENT DOCUMENTS

| | | | | |
|---|---|---|---|---|
| 5,920,116 A * | 7/1999 | Umehara et al. | ............... | 257/669 |
| 5,939,781 A * | 8/1999 | Lacap | ............................ | 257/698 |
| 6,238,953 B1 * | 5/2001 | Tanaka et al. | ................. | 438/112 |
| 6,583,499 B2 * | 6/2003 | Huang et al. | ................... | 257/666 |
| 7,262,491 B2 * | 8/2007 | Islam et al. | .................... | 257/670 |
| 2001/0009301 A1 * | 7/2001 | Azuma | ......................... | 257/698 |
| 2006/0151862 A1 * | 7/2006 | Lin et al. | ....................... | 257/676 |

* cited by examiner

*Primary Examiner* — Thomas L Dickey
*Assistant Examiner* — Nikolay Yushin
(74) *Attorney, Agent, or Firm* — Steven A. Shaw; W. James Brady; Frederick J. Telecky, Jr.

(57) ABSTRACT

A lead frame (410) including a die pad (100) for mounting at least one integrated circuit (405) thereon and a plurality of lead fingers (413). The die pad (100) includes a metal including substrate (105) having a periphery that includes a plurality of sides (111-114), an intersection of the sides forming corners (115). A first plurality of grooves including least one groove (106) is formed in a top side surface of the substrate and is associated with each of the corners (115). The groove (106) has a dimension oriented at least in part at an angle of 75 to 105 degrees relative to a bisecting line (118) originating from the corners (115). A lead-frame-based packaged semiconductor device (400) includes a lead frame (410) including at least one metal comprising die pad (418) and a plurality of lead fingers (413) around the die pad (418). At least one integrated circuit (405) is mounted on the top surface of the die pad (418), and electrically connected to the plurality of lead fingers (413). A mold compound (414) encapsulates the integrated circuit (405), wherein the mold compound (414) is present inside the first plurality of grooves to form a restraint from delaminating between the mold compound (414) and the die pad (418).

11 Claims, 5 Drawing Sheets

LEADFRAME HAVING DELAMINATION RESISTANT DIE PAD

This is a divisional of application Ser. No. 12/131,978 filed Jun. 3, 2008, the contents of which are herein incorporated by reference in its entirety.

FIELD OF THE INVENTION

Embodiments of the present invention relate to die pad designs for lead frame packages and packaged semiconductor devices therefrom.

BACKGROUND

All leaded and certain leadless integrated circuit (IC) packages generally include lead frames. The lead frame includes at least one die pad, wherein the die is attached using a die attach material (e.g. silver epoxy paste or solder paste) to the surface of a solid metal die pad. The die pad metal generally comprises copper and can include a surface such as NiPdAu. The lead frame also includes a plurality of leads which are electrically connected to the active surface of the die by a plurality of bonding wires and are separated from the die pad. A mold compound is provided for encapsulating and bonding to the die and at least the top of the lead frame. In the case of a power IC, the mold compound is generally absent from the bottom of the die pad to improve thermal performance, while for conventional ICs, the mold compound can be present on the bottom of the die pad.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The present Inventors have observed the problem of delamination between the mold compound and the lead frame including the metal die pad that can occur in varying degrees in conventional lead frame-based packaging. Delamination has also been observed between the die attach material under the IC die and the die pad. In the case of delamination between the mold compound and the die pad, it has been identified by the present Inventors that the delamination crack propagation generally originates at the perimeter of the die pad primarily at or near the corner of the die pad, with the cracks propagating in a direction toward the die pad center which generally corresponds to a movement along a bisecting line that originates from the corners.

As described in detail below, by adding at least one groove in the die pad which includes at least a portion that is oriented substantially perpendicular (e.g. 75 to 105 degrees) to each of the bisecting lines, embodiments of the present invention provide crack propagation barriers that resist crack propagation and thus improve reliability of the packaged IC.

DESCRIPTION OF THE DRAWINGS

FIG. 3A shows a top view of an exemplary die pad having a plurality of grooves per quadrant formed in the die pad substrate according to another embodiment of the invention, while

DETAILED DESCRIPTION

Figure 1:
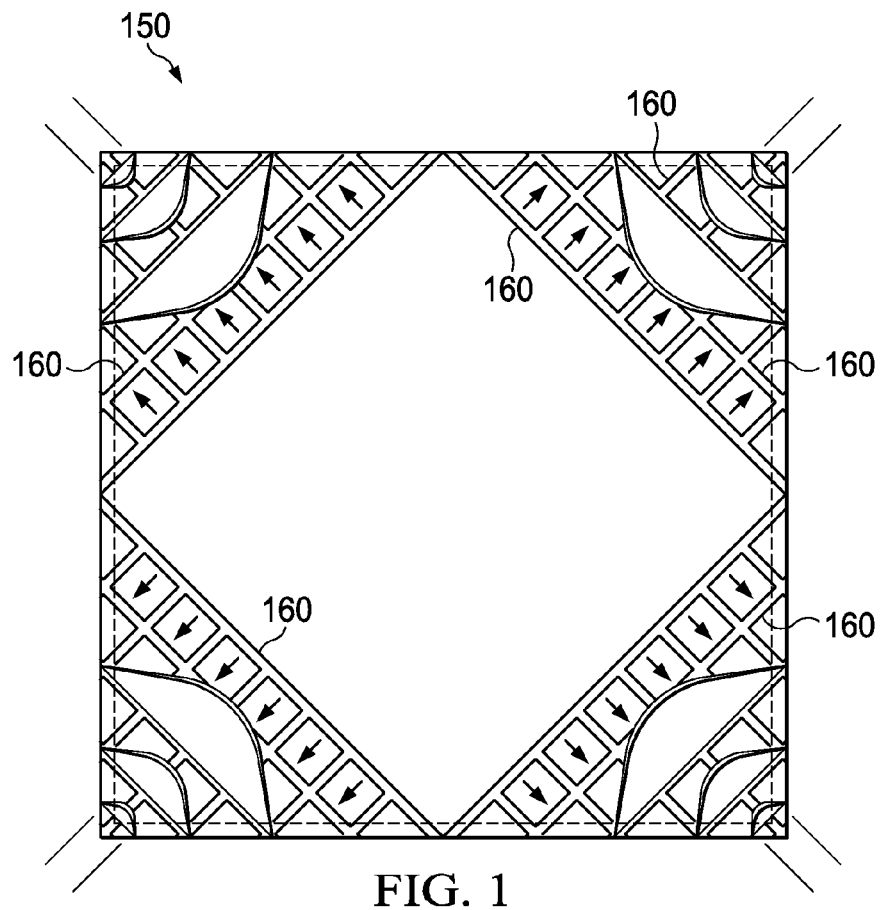
FIG. 1 is a top view of a die pad according to an embodiment of the invention having a plurality of grooves oriented substantially perpendicular to each of the bisecting lines depicting crack propagation being resisted by the grooves.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As described above, the present Inventors have observed that crack propagation generally originates from regions of relatively high stress at the corners of the die pad, and can overcome conventional barriers, such as provided by a half etched die pad design. FIG. 1 is a top view of a die pad 150 according to an embodiment of the invention having a plurality of grooves 160 oriented substantially perpendicular to each of the bisecting lines from the die pad corners depicting crack propagation being resisted by the grooves.

Figure 2A:
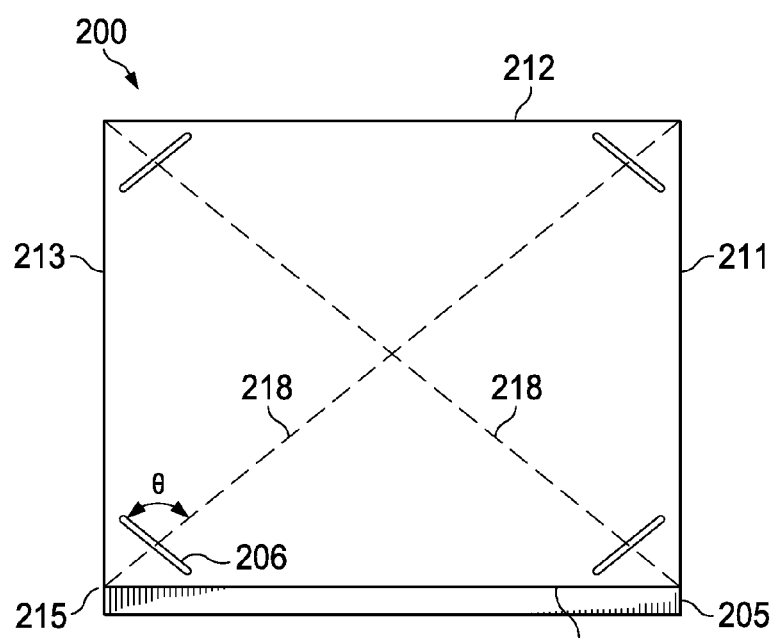
FIG. 2A shows the topside of an exemplary die pad in accordance with an embodiment of the invention.

FIGS. 2A-D are top views of exemplary die pads for mounting ICs thereon, according to various embodiments of the invention. FIG. 2A shows the topside of an exemplary metal comprising die pad 200 comprising a substrate 205 having a first plurality of grooves including one groove 206 per quadrant formed in the top surface of the die attach substrate 205. As defined herein, a quadrant is formed by vertical and horizontal lines through the center (midpoint) of each edge of the die pad. The substrate 205 has a periphery that comprises a plurality of sides 211-214, each intersection of the sides forming corners, such as corner 215. One groove 206 is shown associated with each of the corners and is configured to provide crack propagation barrier that resists crack propagation and thus improves reliability of the packaged IC. As used herein, "associated with" refers to the particular corner the groove is physically closest to.

The grooves generally have a length dimension that exceeds the width of its cross sectional area. In one embodiment, the length of the grooves exceeds the width of its cross sectional area more than 5 to 200 times. The grooves 206 have a length dimension that is oriented at least in part at an angle (shown as 0) of 75 to 105 degrees relative to the bisecting lines 218 originating from each of the corners 215 of the die pad 200. For the square die pad 200 shown, the bisecting lines 218 intersect near the center of the die pad. As described above, this bisecting line 218 corresponds to what the present Inventors have identified as a common crack propagation direction/path. The grooves 206 on the top surface of the die pad having a sufficient width in the common direction of the propagating crack have been identified by the present Inventors to act as barriers to crack propagation of the mold compound to die pad delamination, which as noted in the Summary generally begins at the corners 215 of the die pad. As a result, embodiments of the present invention provide a reduction in mold compound to die pad delamination.

In a typical embodiment, the width of grooves 206 in the common direction of crack propagation is at least 35 µm, such as 50 µm to 200 µm. Widths approaching 20 µm, for example, may be difficult to fill for conventional mold compounds with filler particles resulting in voids which can become crack initiation sites and thus adversely affect reliability.

Although the die pad is shown being substantially square in shape, the die pad 100 can generally be other shapes, such as rectangular, elliptical or circular, or irregular shapes.

The substrate 205 for die pad 200 is generally formed from a metal or metal alloy, such as a copper substrate. In addition, although not shown, the lead frame including the die pad may have a different material at its surface which is generally referred to as a "lead finish" for enhanced solderability or more generally bondability as compared to the die pad substrate material (e.g. copper) Common conventional lead finishes include solder, pure Sn or NiPdAu for Pb-free applications. The lead finish material can be electroplated onto the die pad 200 and surrounding leads (not shown).

Grooves can be formed using any suitable process, for example by an etching process. A stamping process may be used for generally larger groove sizes since the stamping tool may not survive repeated stampings if the groove width is relatively small. The depth of the grooves 206 are generally 20 to 80% of the thickness of the substrate 205. In one particular embodiment, the die pad is 127 µm thick, and the grooves 206 are about 50 µm deep (about 40% of its thickness), the width of the grooves in the common direction of crack propagation is 100 µm at the top surface of the die pad and is 125 to 200 µm at its maximum. At the maximum depth of the groove, the width is zero. The grooves in case of a conventional etching process typically have essentially circular cross-sections. In this case, the maximum width of the groove would be at around half of the depth of the groove. If the grooves are stamped, the grooves will have relatively vertical sidewalls.

Figure 2B:
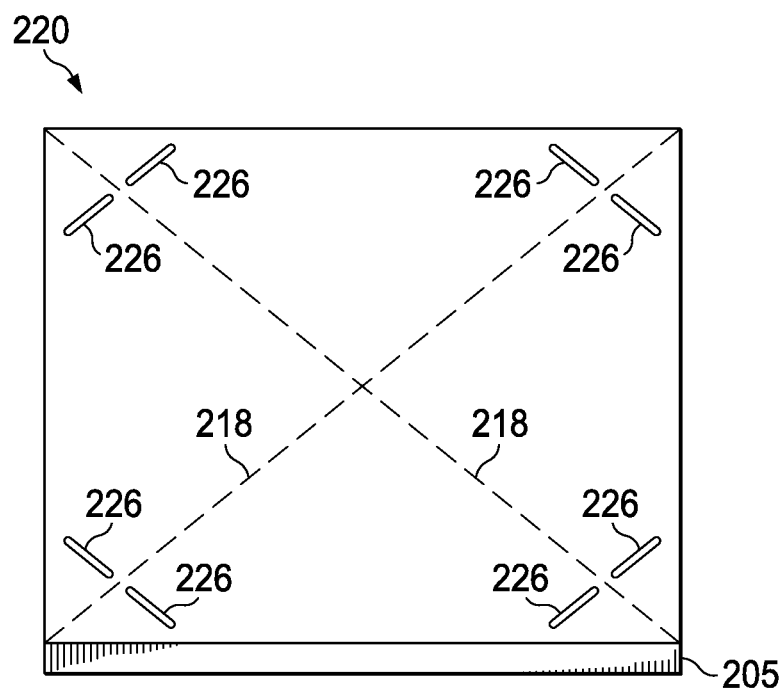
FIG. 2B shows another exemplary die pad in accordance with another embodiment of the invention.

FIG. 2B shows an exemplary die pad 220 having two grooves 226 per quadrant formed in the substrate 205. The two grooves 226 in combination generally help prevent crack propagation from progressing from the corner 215 by providing a longer barrier length around as compared to the single groove 206 per quadrant (of substantially the same size) shown in FIG. 2A.

Figure 2C:
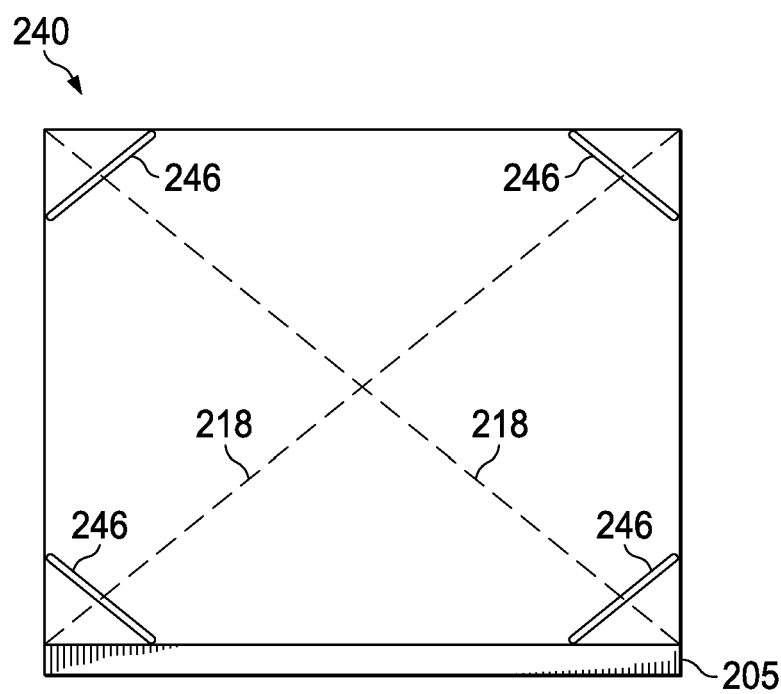
FIG. 2C shows a further exemplary die pad in accordance with a further embodiment of the invention.

FIG. 2C shows an exemplary die pad 240 having a single groove 246 per quadrant formed in the substrate 205. However, in this case, the grooves 246 each extend continuously from one side to another side.

Figure 2D:
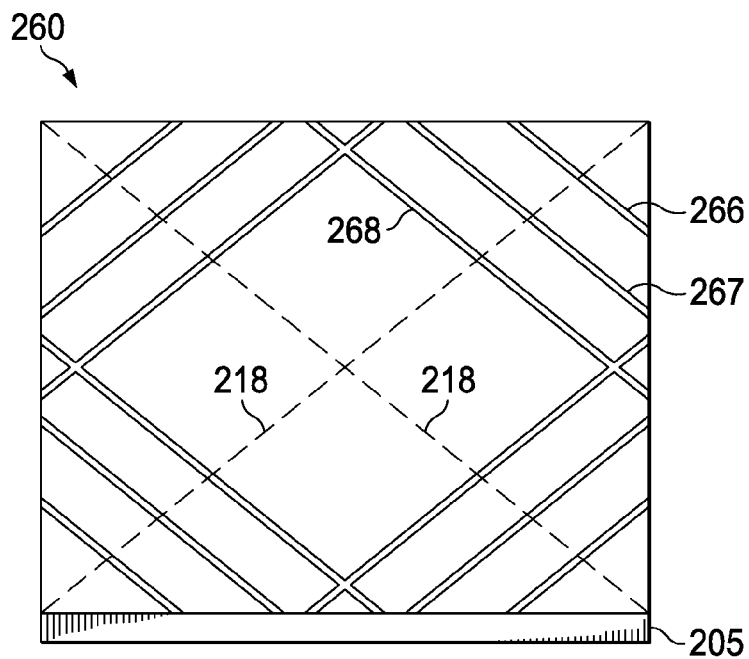
FIG. 2D shows an addition exemplary die pad in accordance with an additional embodiment of the invention.

FIG. 2D shows an exemplary die pad 260 having a plurality of grooves 266-268 per quadrant formed in the substrate 205. Grooves 266-268 provide several levels of delamination restriction. Should a crack propagate past a first groove 266 out from the edge of the die pad, the next groove 267 can act as a second line of defense against crack propagation, and so on. The grooves 266-268 are shown extending continuously from side to side. Some grooves are shown intersecting with other grooves.

Figure 3A:
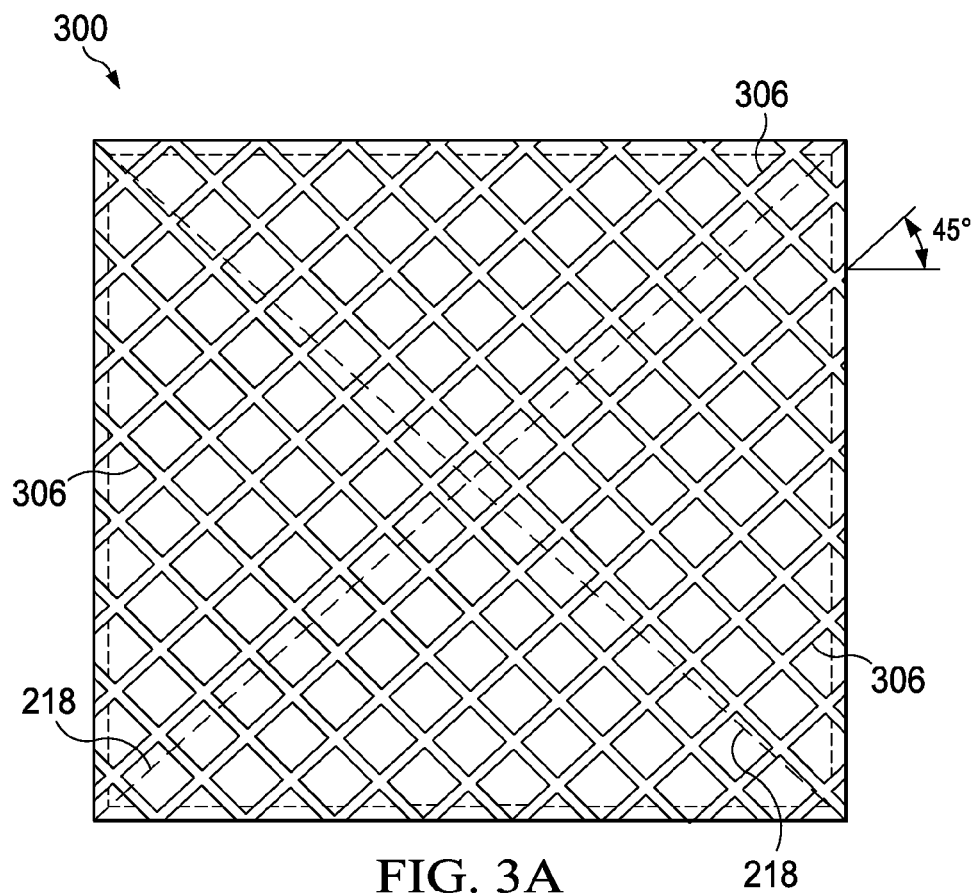

FIG. 3A shows a top view of the topside of an exemplary die pad 300 having a plurality of grooves 306 per quadrant formed in the die pad substrate 205. The grooves 306 shown extend continuously from side to side and cover the full die pad surface. The grooves are oriented at an angle of nearly 45 degrees with respect to the sides of the die pad 300, which translated to an angle of nearly 90 degrees with respect to bisecting lines 218 which as described above corresponds to what the present inventors have identified as a common crack propagation direction/path. As a result of the grooves 306 being in the die attach area, the die attach material (e.g. silver epoxy) in assembly will fill the grooves and thus generally significantly reduce or eliminate die pad delamination at a lower bond line thickness.

As known in the art, after die mounting the die attach adhesive tends to spread outward in the die pad plane (laterally) beyond the die edges. Embodiments of the invention where the grooves reach the die pad surface under the die can provide a significant reduction in lateral spreading, thereby reducing excessive adhesive bleed out. This can maximize the die dimension that can be fit on a die pad. This can also create a shorter fillet height and allow the mold compound to grip around the top edges of the die.

Figure 3B:
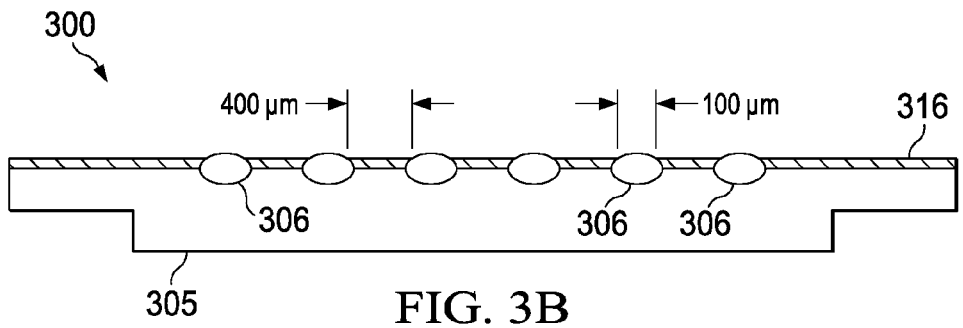
FIG. 3B shows a cross sectional view of the die pad shown in FIG. 3A evidencing the "half etched" feature.

FIG. 3B shows a cross sectional view of the die pad 300 shown in FIG. 3A showing grooves 306. A lead finish layer 316 is generally over the entire lead frame and is shown on the top side surface of substrate 205. The lead finish layer 316 can line the grooves if deposited (e.g. plated) after formation of the grooves, or be absent from the grooves if the grooves are formed after the lead finish layer 316 is deposited. The risk of the plating metals filling up the grooves is minimal because the plating thickness is usually in angstroms, which is very small (<1%) as compared to the typical depth of the groove. A total maximum plating thickness is generally less than a micron. The "half etched" feature on the bottom side of the die pad is also shown in FIG. 3B. In addition, exemplary groove dimensions are shown. The half etched features allows mold compound to be placed under the die pad periphery as well as the topside of the die pad. As known in the art, in assembly to implement a power pad package, the backside of the die pad outside the half etched feature region is not covered with mold compound to promote thermal conducting directly from the die pad substrate (e.g. copper) to the board or heat sink.

Figure 4A:
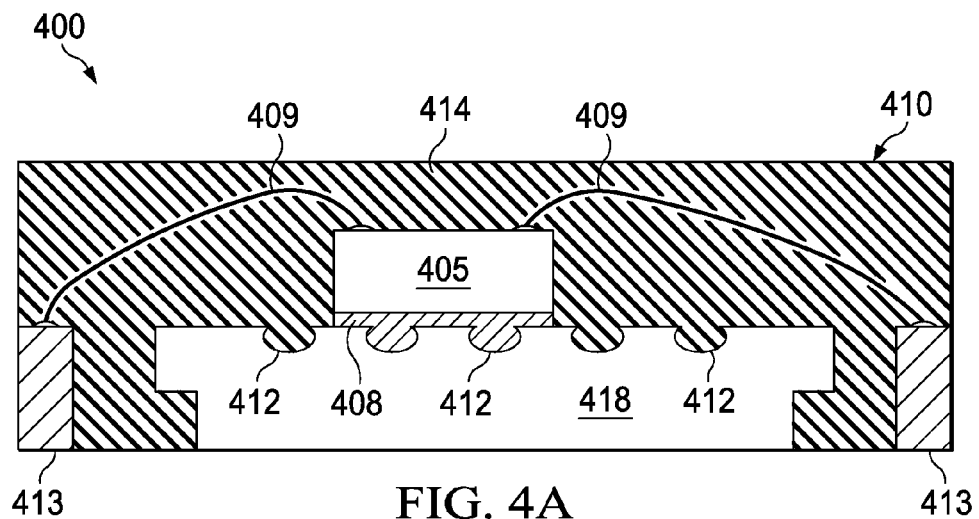
FIG. 4A shows a side view depiction of a packaged die in a leadless package comprising a die attached to the die pad of a lead frame according to an embodiment of the invention having a plurality of grooves.

FIG. 4A shows a side view depiction of a packaged die 400 in a leadless package comprising a die 405 attached to the die pad 418 of a lead frame 410 according to an embodiment of the invention having a plurality of grooves 412. Mold compound 414 is shown gripping the die pad including into the grooves 412 on the top of the die pad 418 and below the die pad under the half etch features on the periphery of the die pad 410.

Leads fingers are shown as 413 and are coupled to the die 405 by bond wires 409. Die attach material 408 is shown between the die 405 and the die pad 418 and inside grooves 412 located under the die 405. Package die 400 is also shown in a power pad package arrangement, wherein the backside of the die pad 418 outside the half etched feature region is not covered with mold compound 414 and thus allows the die pad material (e.g. Cu) to conduct heat away from the die 405. The leadless package can be a variety of package types, such as Quad Flat No-Lead (QFN) and Small Outline No-Lead (SON).

Figure 4B:
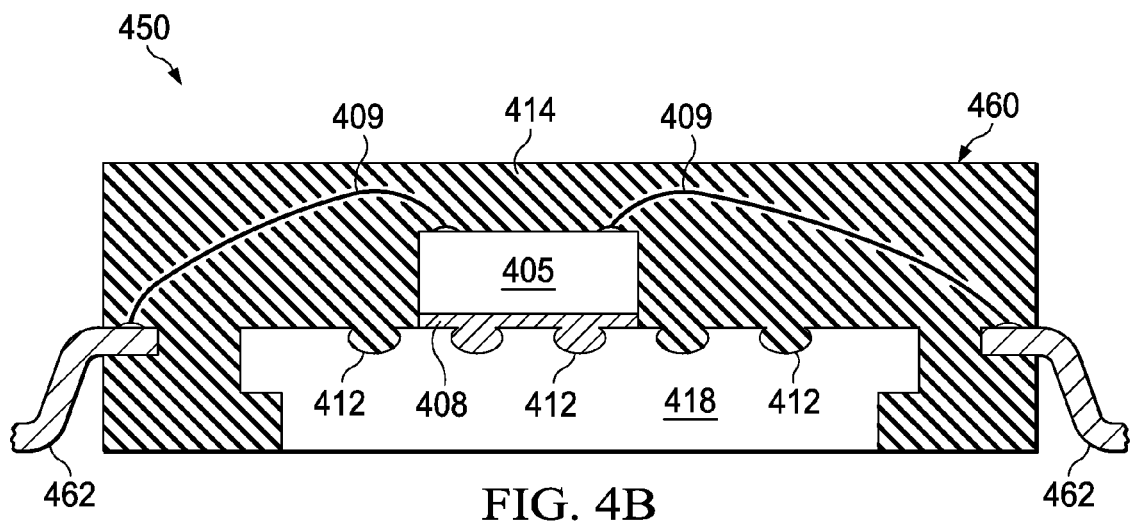
FIG. 4B shows a side view depiction of a packaged die in a leaded package comprising a die attached to the die pad of a lead frame according to an embodiment of the invention having a plurality of grooves.

FIG. 4B shows a side view depiction of a packaged die 450 in a leaded package comprising a die 405 attached to the die pad 418 of a lead frame 460 according to an embodiment of the invention having a plurality of grooves 412. Gull-winged leads are shown as 462 and are coupled to the die 405 by bond wires 409. The leaded package for packaged die 450 can be a variety of leaded package types, such as a quad flat package (QFP) and Plastic Leaded Chip Carriers (PLCC) and small outline ICs (SOIC).

Figure 5A:
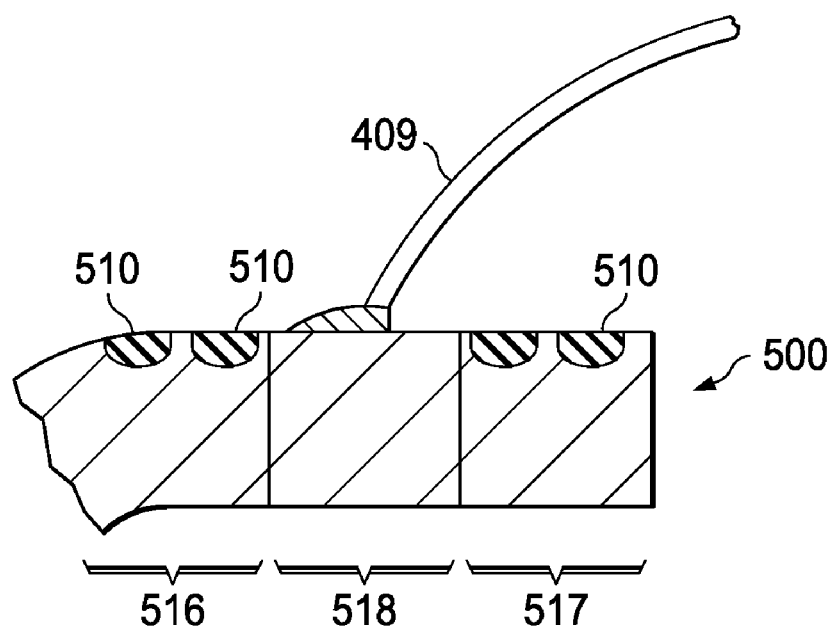
FIGS. 5A and 5B show a side view and a top view of a grooved lead finger, wherein top surface of the lead fingers includes grooves according to an embodiment of the invention on both sides of the lead finger, but not in the center region around where the stitch bond of a bond wire to the lead finger is generally made.
Figure 5B:
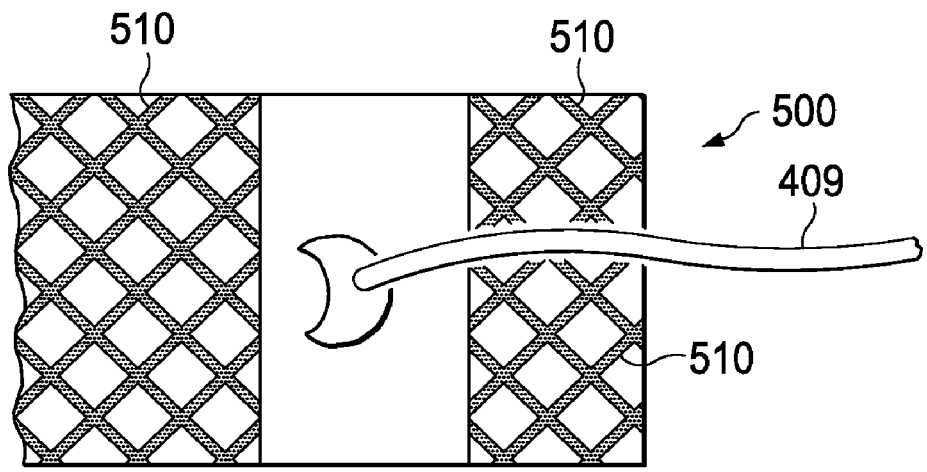

In another embodiment of the invention, a portion of the top surface of the lead fingers can include grooves according to an embodiment of the invention for enhanced adhesion of the mold compound to reduce the risk of stitch lift. FIG. 5A and 5B show a side view and a top view of a grooved lead finger 500, wherein top surface of the lead fingers includes grooves according to an embodiment of the invention on both sides 516 and 517 of the lead finger, but not in the center region portion 518 around where the stitch bond of bond wire 409 to the lead finger 500 is made. As shown, the lead finger grooves 510 are oriented at an angle of 75 to 105 degrees relative to a bisecting line originating from the corners of the lead finger 500. The lead finger grooves 510 may be formed and have dimensions described above relative to die pad grooves. The grooves 510 are shown filled with mold compound which provides enhanced adhesion of the mold compound.

Although not show, embodiments of the invention also include stacked die devices. In such embodiments the stacked die device can generally use one or more lead frames according to embodiments of the invention described above relative to single die embodiments.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A semiconductor device, comprising:
a die pad with a top surface to which a semiconductor chip is attached;
the die pad further comprising a periphery of four edges, which extend and form four corners;
a plurality of grooves in the top surface oriented at an angle of 75 to 105 degrees relative to lines bisecting the four corners.

2. The semiconductor device of claim 1, in which some of the plurality of grooves span from an edge to a second edge.

3. The semiconductor device of claim 1, in which some of the plurality of grooves intersect other of the plurality of grooves.

4. The semiconductor device of claim 1, in which a number of the plurality of grooves are parallel to one another.

5. The semiconductor device of claim 1, wherein the grooves are between 50 to 200 µm wide.

6. The semiconductor device 1, further comprising leads electrically connected to the semiconductor chip.

7. The semiconductor device of claim 6, in which the leads have grooves similar to the grooves in the die pad.

8. The semiconductor device of claim 1, further comprising a mold structure of a molding compound covering the semiconductor chip and filling the plurality of grooves.

9. The semiconductor device of claim 8, wherein the die pad has a bottom surface exposed from the mold structure.

10. The semiconductor device of claim 8, in which portions of a number of the plurality of grooves are covered by the semiconductor chip.

11. The semiconductor device of claim 10, in which the portions of the grooves covered by the semiconductor are free of the molding compound.

* * * * *